(12) United States Patent
Tan

(10) Patent No.: US 11,063,235 B2
(45) Date of Patent: Jul. 13, 2021

(54) DISPLAY PANEL COMPRISING AUXILIARY ELECTRODE LAYER AND MANUFACTURING METHOD THEREOF

(71) Applicant: Shenzhen China Star Optoelectronics Semiconductor Display Technology Co., Ltd., Guangdong (CN)

(72) Inventor: Wei Tan, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 4 days.

(21) Appl. No.: 16/627,772

(22) PCT Filed: Dec. 27, 2019

(86) PCT No.: PCT/CN2019/129150
§ 371 (c)(1),
(2) Date: Dec. 31, 2019

(65) Prior Publication Data
US 2021/0184157 A1 Jun. 17, 2021

(51) Int. Cl.
*H01L 51/52* (2006.01)
*H01L 27/32* (2006.01)
*H01L 51/00* (2006.01)
*H01L 51/56* (2006.01)

(52) U.S. Cl.
CPC ...... *H01L 51/5228* (2013.01); *H01L 27/3246* (2013.01); *H01L 51/001* (2013.01); *H01L 51/56* (2013.01); *H01L 2227/323* (2013.01); *H01L 2251/556* (2013.01)

(58) Field of Classification Search
None
See application file for complete search history.

(56) References Cited

U.S. PATENT DOCUMENTS

| | | | |
|---|---|---|---|
| 2016/0211316 A1* | 7/2016 | Oh | H01L 51/56 |
| 2017/0033166 A1 | 2/2017 | Shim et al. | |
| 2017/0110532 A1* | 4/2017 | Kim | H01L 51/0096 |
| 2018/0254430 A1* | 9/2018 | Zhao | H01L 51/5221 |
| 2019/0245013 A1 | 8/2019 | Yang et al. | |
| 2019/0305245 A1 | 10/2019 | Hwang et al. | |

FOREIGN PATENT DOCUMENTS

| | | |
|---|---|---|
| CN | 105637667 A | 6/2016 |
| CN | 106409870 A | 2/2017 |
| CN | 108336116 A | 7/2018 |
| CN | 108780805 A | 11/2018 |
| JP | 2013134813 A | 7/2013 |

\* cited by examiner

*Primary Examiner* — Nduka E Ojeh
(74) *Attorney, Agent, or Firm* — Mark M. Friedman

(57) ABSTRACT

A display panel and a manufacturing thereof, including a substrate, a pixel defining layer, an auxiliary electrode layer, an electron transport layer, a cathode layer, an organic layer, and a metal layer. The pixel defining layer includes a plurality of pixel openings. The auxiliary electrode layer includes a first auxiliary electrode sublayer and a second auxiliary electrode sublayer sequentially disposed on the pixel defining layer. The first auxiliary electrode sublayer is provided with a groove portion. The metal layer is disposed between the second auxiliary electrode sublayer and the cathode layer and corresponding to the groove portion.

11 Claims, 4 Drawing Sheets

DISPLAY PANEL COMPRISING AUXILIARY ELECTRODE LAYER AND MANUFACTURING METHOD THEREOF

FIELD OF APPLICATION

The present application is related to the field of display panel technology, and specifically to a display panel and a manufacturing method thereof.

BACKGROUND OF APPLICATION

Organic light-emitting diode (OLED) display devices are self-luminous and all-solid-state and have low driving voltage, high luminous efficiency, short response time, high definition and contrast, near 180° viewing angles, and wide operating temperature range, which can realize advantages such as flexible display and large-area and full-color display and are recognized as the most promising display devices in the industry.

SUMMARY OF APPLICATION

A current OLED display panel generally includes a thin-film transistor (TFT) substrate, an anode disposed on the TFT substrate, an organic light-emitting layer disposed on the anode, and a cathode disposed on the organic light-emitting layer. Common cathodes of top-emitting OLED display panels generally use metals with high transmittance or transparent conductive oxide (TCO). This type of metal cathodes with high transmittance has a problem of high sheet resistance, especially in large-size printed OLED display panels, of which common cathodes have a high sheet resistance that can cause severe power supply voltage drop (IR-drop), making their brightness uniformity poor.

The present application provides a display panel and a manufacturing method thereof to solve a technical problem of the poor uniformity of the large-size printed OLED display panels caused by their high sheet resistance of the common cathodes and the severe power supply voltage drop.

An embodiment of the present application provides a display panel including:

a substrate;

a pixel defining layer disposed on the substrate and provided with a plurality of pixel openings;

an auxiliary electrode layer disposed on the pixel defining layer and adjacent to each of the plurality of pixel openings, wherein the auxiliary electrode layer includes a first auxiliary electrode sublayer disposed on the pixel defining layer and a second auxiliary electrode sublayer disposed on the first auxiliary electrode sublayer, and the first auxiliary electrode sublayer is provided with a groove portion near each of the plurality of pixel openings;

an electron transport layer disposed on the pixel defining layer and the auxiliary electrode layer;

a cathode layer disposed on the electron transport layer;

an organic layer disposed on the cathode layer; and a metal layer disposed between the second auxiliary electrode sublayer and the cathode layer and corresponding to the groove portion.

In the display panel of an embodiment of the present application, a thickness of the first auxiliary electrode sublayer is greater than a sum of thicknesses of the electron transport layer, the cathode layer, and the organic layer.

In the display panel of an embodiment of the present application, an opening is disposed between the second auxiliary electrode sublayer and the organic layer and is in communication with the groove portion, and the metal layer is disposed at the opening and connected to the second auxiliary electrode sublayer and the cathode layer.

In the display panel of an embodiment of the present application, the organic layer includes a first organic sublayer disposed on the pixel defining layer and a second organic sublayer disposed on the auxiliary electrode layer, the first organic sublayer and the second organic sublayer have same material, and the opening is disposed between the first organic sublayer and the second auxiliary electrode sublayer.

In the display panel of an embodiment of the present application, material of the first auxiliary electrode sublayer includes aluminum or silver, and material of the second auxiliary electrode sublayer includes transparent oxide.

In the display panel of an embodiment of the present application, material of the organic layer includes a conductive patterning material, material of the metal layer includes a conductive electrode material, and the conductive patterning material and the conductive electrode material are mutually exclusive.

In the display panel of an embodiment of the present application, the display panel further includes an anode layer disposed on the substrate and corresponding to each of the plurality of pixel openings and an organic light-emitting layer disposed in each of the plurality of pixel openings and disposed on the anode layer, wherein the electron transport layer is disposed on the organic light-emitting layer, the pixel defining layer, and the auxiliary electrode layer.

According to the above purpose, the present application further provides a manufacturing method of the display panel including the steps of:

providing a substrate and forming a pixel defining layer with a plurality of pixel openings on the substrate;

forming an auxiliary electrode layer on the pixel defining layer and adjacent to each of the plurality of pixel openings, wherein the auxiliary electrode layer includes a first auxiliary electrode sublayer formed on the pixel defining layer and a second auxiliary electrode sublayer formed on the first auxiliary electrode sublayer, and the first auxiliary electrode sublayer is formed with a groove portion near each of the plurality of pixel openings;

sequentially forming an electron transport layer and a cathode layer on the pixel defining layer and the auxiliary electrode layer; and forming an organic layer on the cathode layer and forming a metal layer corresponding to the groove portion between the second auxiliary electrode sublayer and the cathode layer.

In the manufacturing method of the display panel of an embodiment of the present application, the step of forming the auxiliary electrode layer on the pixel defining layer and adjacent to each of the plurality of pixel openings, wherein the auxiliary electrode layer includes the first auxiliary electrode sublayer formed on the pixel defining layer and the second auxiliary electrode sublayer formed on the first auxiliary electrode sublayer, and the first auxiliary electrode sublayer is formed with the groove portion near each of the plurality of pixel openings includes the steps of:

forming the first auxiliary electrode sublayer on the pixel defining layer, wherein a thickness of the first auxiliary electrode sublayer is greater than a sum of thicknesses of the electron transport layer, the cathode layer, and the organic layer;

forming the second auxiliary electrode sublayer on the first auxiliary electrode sublayer; and forming the groove portion on the first auxiliary electrode sublayer near each of the plurality of pixel openings.

In the manufacturing method of the display panel of an embodiment of the present application, the step of forming the organic layer on the cathode layer and forming the metal layer corresponding to the groove portion between the second auxiliary electrode sublayer and the cathode layer includes the steps of:

forming the organic layer on the cathode layer, wherein material of the organic layer includes a conductive patterning material; and forming the metal layer corresponding to the groove portion between the second auxiliary electrode sublayer and the cathode layer by using a conductive electrode material mutually exclusive with the conductive patterning material of the organic layer.

In the manufacturing method of the display panel of an embodiment of the present application, the organic layer and the metal layer are both made by evaporation.

In the manufacturing method of the display panel of an embodiment of the present application, a vapor deposition temperature of the organic layer ranges from 150 to 250° C.

In the manufacturing method of the display panel of an embodiment of the present application, a vapor deposition temperature of the metal layer ranges from 500 to 650° C.

The present application provides the display and the manufacturing method thereof. The auxiliary electrode layer is disposed on the pixel defining layer, and the second auxiliary electrode sublayer in the auxiliary electrode layer is electrically connected to the cathode layer by the metal layer, thereby reducing resistance of the cathode layer, reducing the power supply voltage drop of the display panel, and ensuring the brightness uniformity of the display panel. In addition, the manufacturing method of the display panel is simple and efficient, which is suitable for mass production.

DESCRIPTION OF DRAWINGS

The following describes specific embodiments of the present application in detail with reference to the accompanying drawings, which will make technical solutions and other beneficial effects of the present application obvious.

DETAILED DESCRIPTION OF PREFERRED EMBODIMENTS

Figure 1:
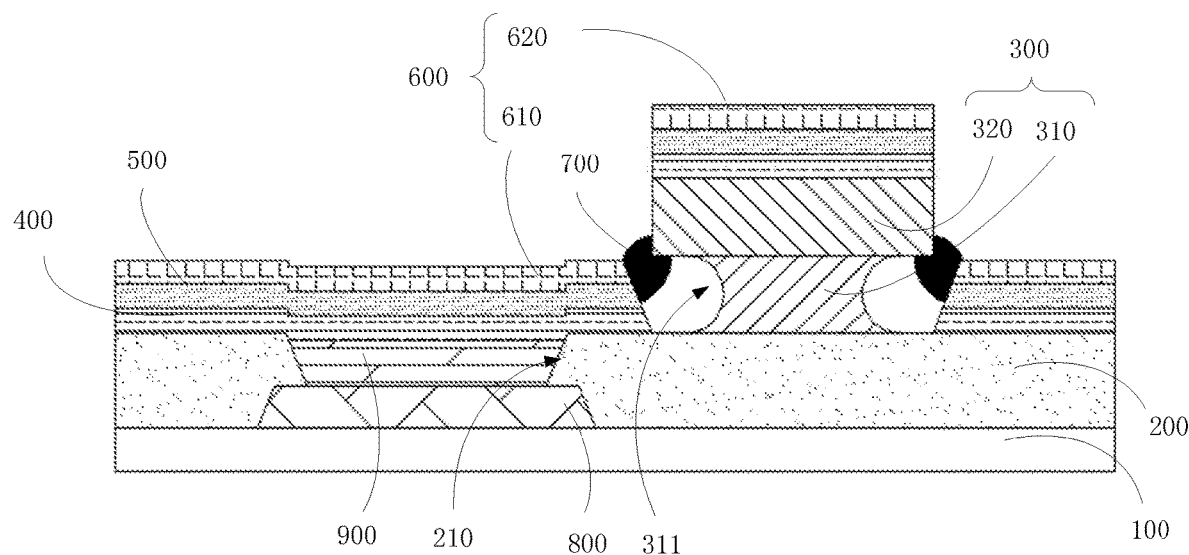
FIG. 1 is a structural diagram of a display panel according to an embodiment of the present application.

To further explain the technical means and effect of the present application, the following refers to embodiments and drawings for detailed description. Obviously, the described embodiments are only for some embodiments of the present application, instead of all embodiments. Based on the embodiments of the present application, all other embodiments obtained by those skilled in the art without creative work fall into a protection scope of the present application.

Directional terms mentioned in the present application, such as upper, lower, front, rear, left, right, in, out, side, etc., only refer to directions in the accompanying drawings. Thus, the adoption of directional terms is used to describe and understand the present application, but not to limit the present application. In addition, the terms "first" and "second" are merely used for illustrative purposes only, but are not to be construed as indicating or imposing a relative importance or implicitly indicating the number of technical features indicated. Thus, a feature that defines "first" or "second" may expressly or implicitly include one or more of the features. In the description of the present application, the meaning of "plural" is two or more, unless otherwise specified.

In the present application, unless otherwise specifically stated and defined, terms "connected", "fixed", etc. should be interpreted expansively. For example, "fixed" may be fixed connection, also may be detachable connection, or integration; may be mechanical connection, also may be electrical connection; may be direct connection, also may be indirect connection through an intermediate, and may be internal communication between two elements or interaction of two elements, unless otherwise specifically defined. The ordinary skill in this field can understand the specific implication of the above terms in the present disclosure according to specific conditions.

In the present application, unless otherwise specifically stated and defined, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Various embodiments or examples are provided here below to implement the different structures of the present application. To simplify the disclosure of the present application, description of the components and arrangements of specific examples is given below. Of course, they are only illustrative and not limiting the present application. Moreover, in the present application, reference numbers and/or letters may be repeated in different embodiments. Such repetition is for the purposes of simplification and clearness, and does not denote the relationship between respective embodiments and/or arrangements being discussed. Furthermore, the present application provides various examples for specific process and materials. However, it is obvious for a person of ordinary skill in the art that other processes and/or materials may alternatively be utilized.

Figure 2:
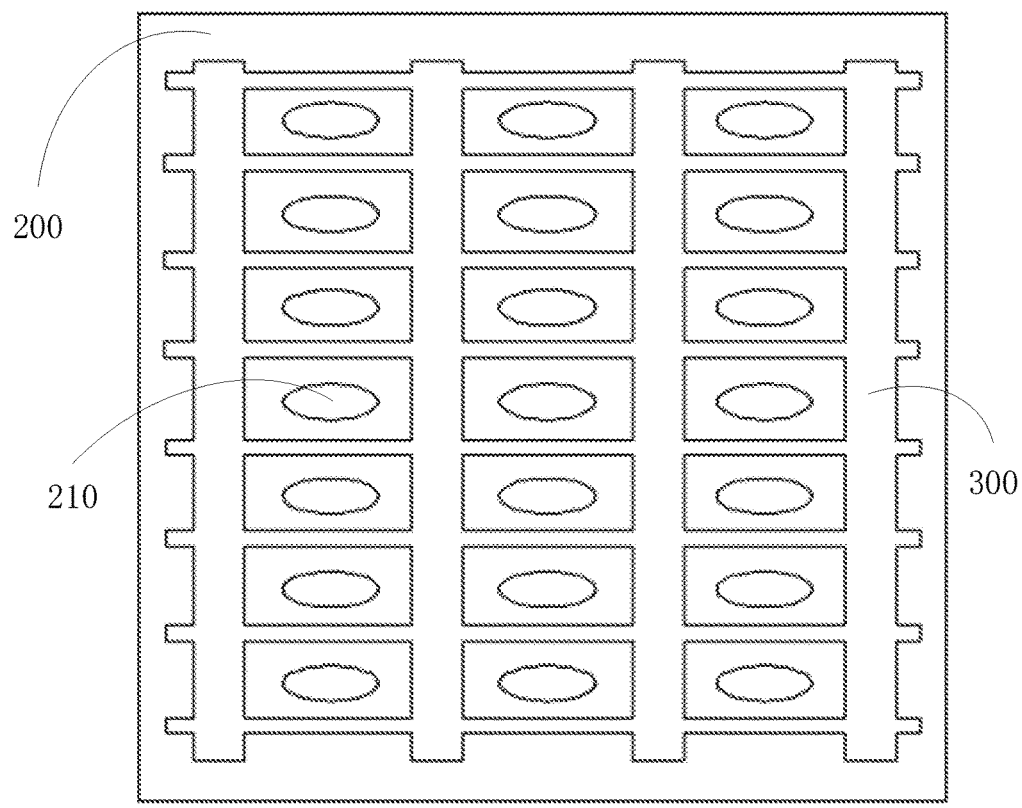
FIG. 2 is a structural diagram of an auxiliary electrode layer and a plurality of pixel openings in the display panel according to an embodiment of the present application.

Referring to FIGS. 1 and 2, the present application provides a display panel including:

a substrate 100;

a pixel defining layer 200 disposed on the substrate 100 and provided with a plurality of pixel openings 210;

an auxiliary electrode layer 300 disposed on the pixel defining layer 200 and adjacent to each of the plurality of pixel openings 210, wherein the auxiliary electrode layer 300 includes a first auxiliary electrode sublayer 310 disposed on the pixel defining layer 200 and a second auxiliary electrode sublayer 320 disposed on the first auxiliary electrode sublayer 310, and the first auxiliary electrode sublayer 310 is provided with a groove portion 311 near each of the plurality of pixel openings 210;

an electron transport layer 400 disposed on the pixel defining layer 200 and the auxiliary electrode layer 300;

a cathode layer 500 disposed on the electron transport layer 400;

an organic layer 600 disposed on the cathode layer 500; and a metal layer 700 disposed between the second auxiliary electrode sublayer 320 and the cathode layer 500 and corresponding to the groove portion 311.

Understandably, metal cathodes with high transmittance have a problem of high sheet resistance, especially in large-size printed OLED display panels, of which common cathodes have a high sheet resistance that can cause severe power supply voltage drop, making their brightness uniformity poor. The present application disposes the auxiliary electrode layer 300 on the pixel defining layer 200 and connects the auxiliary electrode layer 300 to the cathode layer 500, thereby reducing resistance of the cathode layer 500 and ensuring the brightness uniformity of the display panel. Specifically, the second auxiliary electrode sublayer 320 in the auxiliary electrode layer 300 is electrically connected to the cathode layer 500 by the metal layer 700, thereby achieving a purpose of reducing the resistance of the cathode layer 500. A distance between the first auxiliary electrode sublayer 310 and the electron transport layer 400 can be enlarged by forming the groove portion 311 on the first auxiliary electrode sublayer 310 near each of the plurality of pixel openings 210, thereby preventing a connection between the first auxiliary electrode sublayer 310 and the electron transport layer 400 from affecting display effects of the display panel. In addition, Material of the first auxiliary electrode sublayer 310 is different from material of the second auxiliary electrode sublayer 320. Specifically, the material of the first auxiliary electrode sublayer 310 includes aluminum or silver, and the material of the second auxiliary electrode sublayer 320 includes transparent oxide.

In an embodiment, a thickness of the first auxiliary electrode sublayer 310 is greater than a sum of thicknesses of the electron transport layer 400, the cathode layer 500, and the organic layer 600. Obviously, if the thickness of the first auxiliary electrode sublayer 310 is greater than a sum of thicknesses of the electron transport layer 400, the cathode layer 500, and the organic layer 600, a horizontal level of the second auxiliary electrode sublayer 320 is higher than the organic layer 600, which prevents the second auxiliary electrode sublayer 320 from directly contacting the organic layer 600 and does not close a space of the groove portion 311 for forming the metal layer 700.

In an embodiment, an opening is disposed between the second auxiliary electrode sublayer 320 and the organic layer 600 and is in communication with the groove portion 311. The metal layer 700 is disposed at the opening and connected to the second auxiliary electrode sublayer 320 and the cathode layer 500. Understandably, the opening can be made by etching or other manufacturing methods or can be implemented by a height difference between the second auxiliary electrode sublayer 320 and the metal layer 700 mentioned above.

The organic layer 600 includes a first organic sublayer 610 disposed on the pixel defining layer 200 and a second organic sublayer 620 disposed on the auxiliary electrode layer 300. The first organic sublayer 610 and the second organic sublayer 620 have same material. The opening is disposed between the first organic sublayer 610 and the second auxiliary electrode sublayer 320. Understandably, because of a configuration of the auxiliary electrode layer 300 and a thickness of the organic layer 600, which much smaller than a thickness of the auxiliary electrode layer 300, during a process of forming the organic layer 600, the organic layer 600 will be divided into the first organic sublayer 610 formed on the pixel defining layer 200 and the second organic sublayer 620 formed on the auxiliary electrode layer 300. Furthermore, the segmentation phenomenon mentioned above will also occur to a formation of the electron transport layer 400 and the cathode layer 500.

In an embodiment, material of the organic layer 600 includes a conductive patterning material (CPM), material of the metal layer 700 includes a conductive electrode material (CEM), and the conductive patterning material and the conductive electrode material are mutually exclusive. Specifically, the conductive patterning material is a low-temperature organic material, and the conductive electrode material is a metal. The conductive patterning material and the conductive electrode material are both from OTI Lumionics company.

Because the conductive patterning material and the conductive electrode material are mutually exclusive, in an actual production, the organic layer 600 can be deposited first, and then the metal layer 700 can be deposited. Because the two material are mutually exclusive, the metal layer 700 has a self-assembly process, and the metal layer 700 is deposited only in a region not covered by the organic layer 600, which means that the metal layer 700 is patterned in a negative region of the organic layer 600. A vapor deposition temperature of the organic layer 600 ranges from 150 to 250° C. A vapor deposition temperature of the metal layer ranges from 500 to 650° C.

In an embodiment, the display panel further includes an anode layer 800 disposed on the substrate 100 and corresponding to each of the plurality of pixel openings 210 and an organic light-emitting layer 900 disposed in each of the plurality of pixel openings 210 and disposed on the anode layer 800. The electron transport layer 400 is disposed on the organic light-emitting layer 900, the pixel defining layer 200, and the auxiliary electrode layer 300. Specifically, a region of the anode layer 800 not covered by the pixel defining layer 200 corresponds to the plurality of pixel openings 210.

Figure 3:
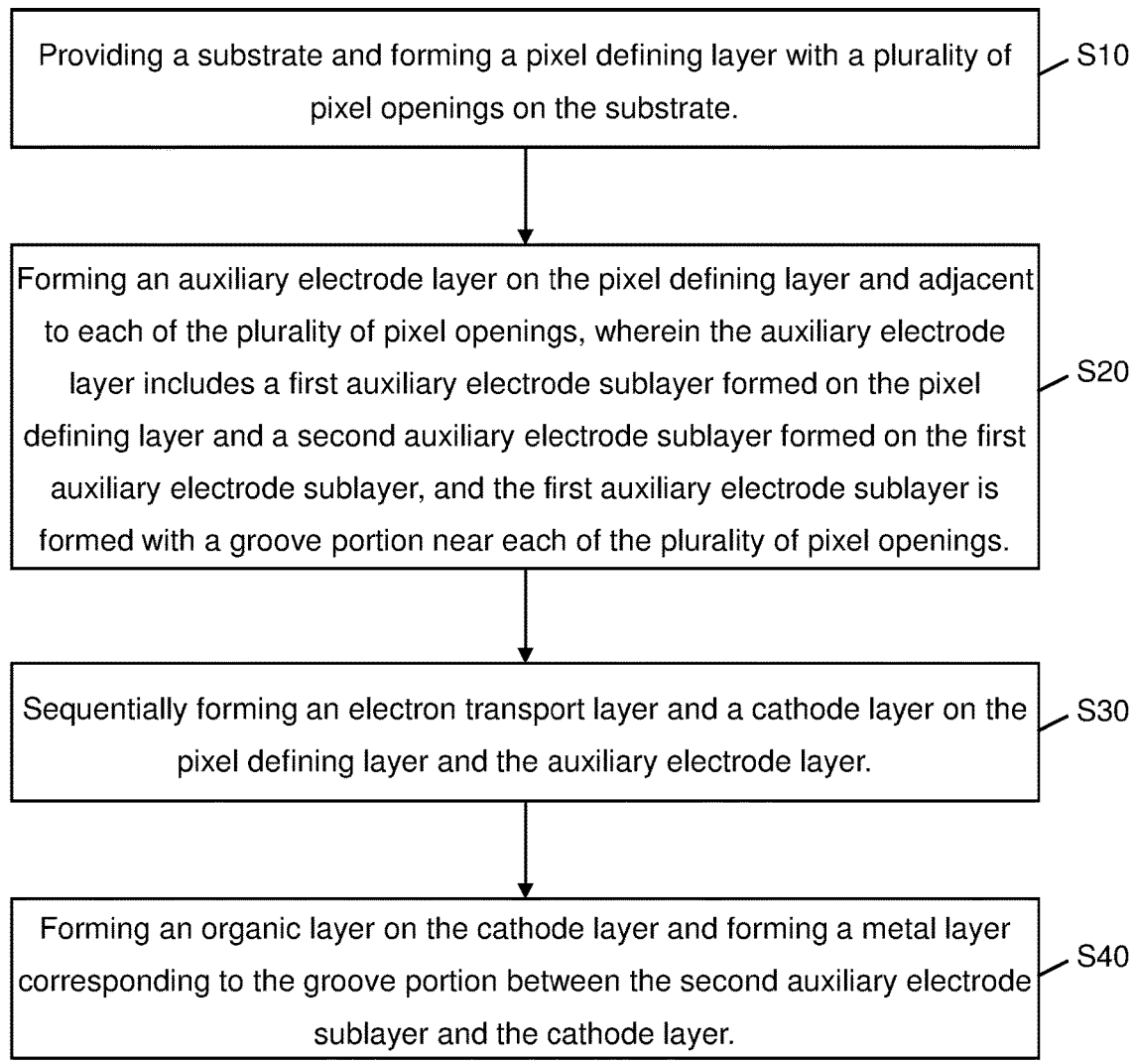
FIG. 3 is a flowchart of a manufacturing method of the display panel according to an embodiment of the present application.
Figure 4:
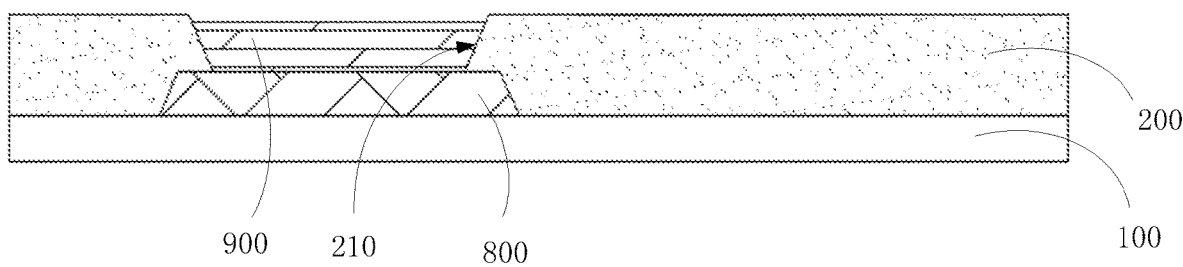
FIGS. 4 to 8 are structural diagrams of manufacturing processes of the manufacturing method of the display panel according to an embodiment of the present application.
Figure 5:
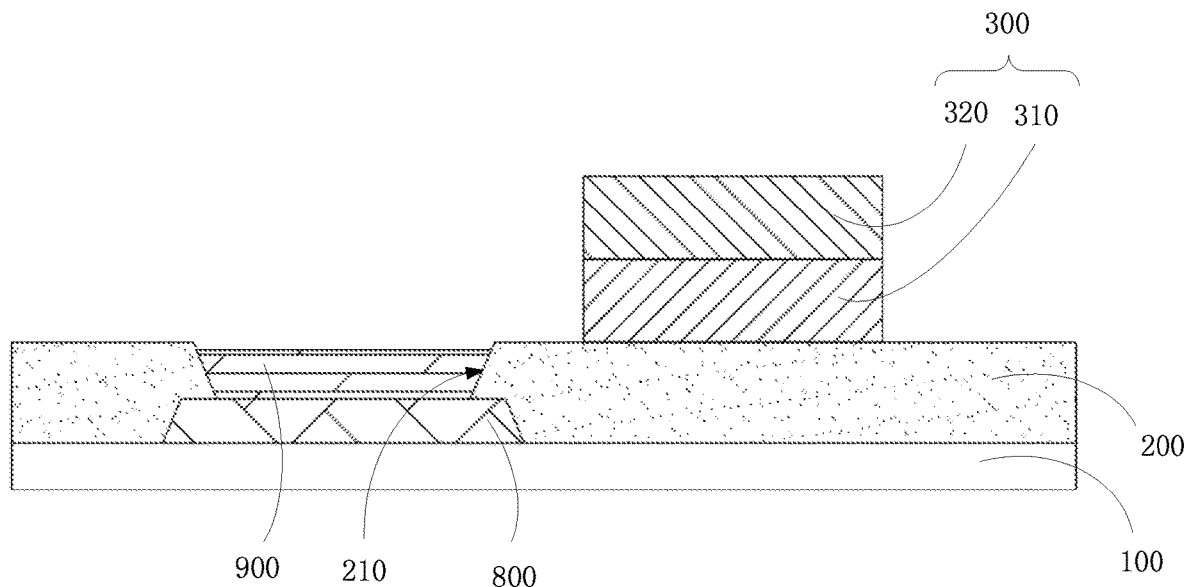
Figure 6:
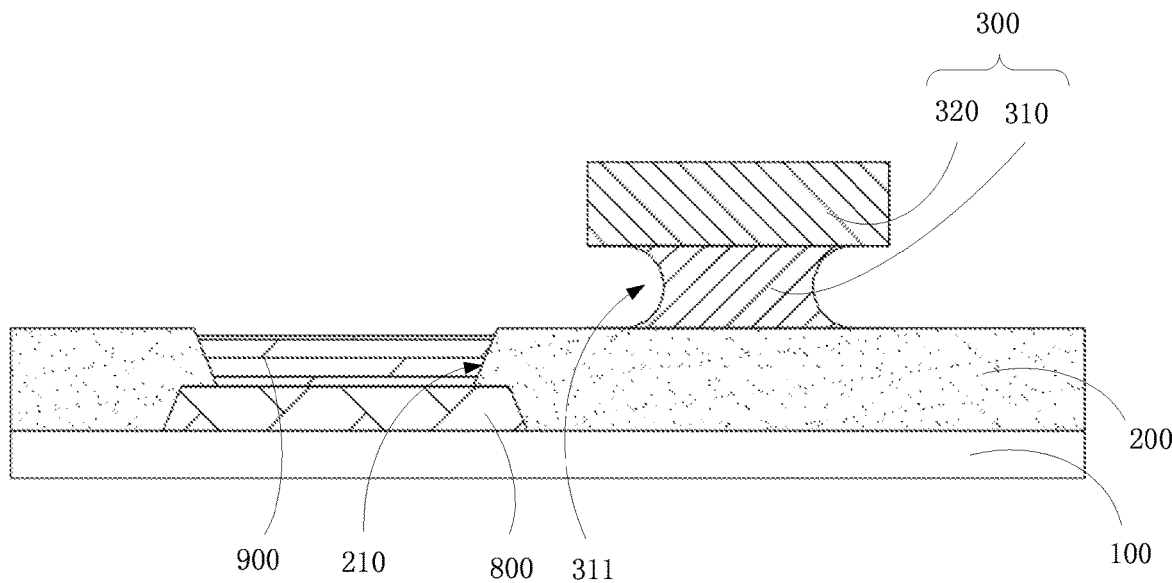
Figure 7:
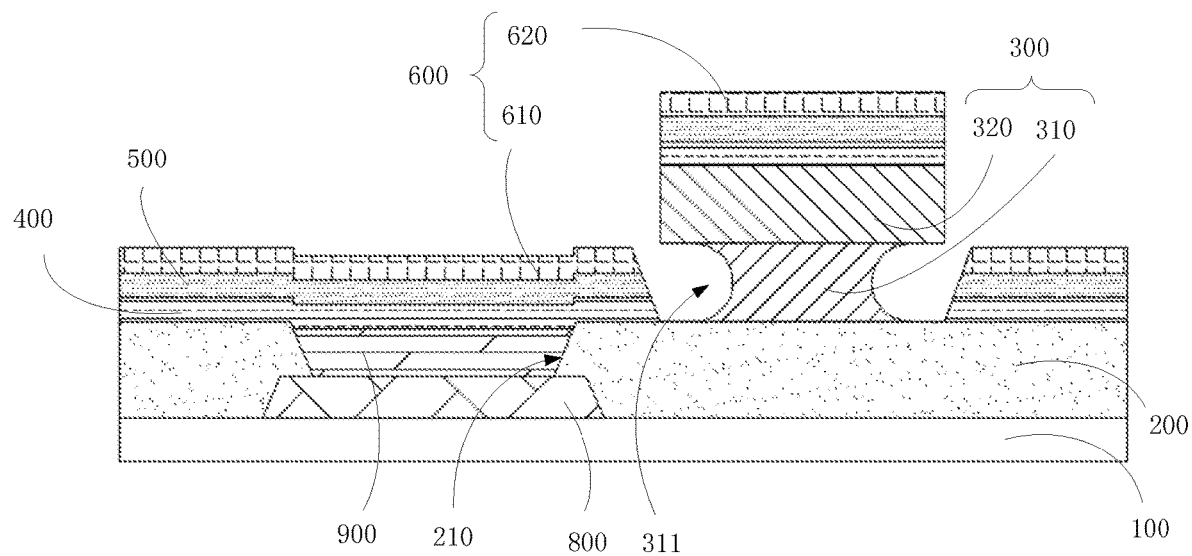
Figure 8:
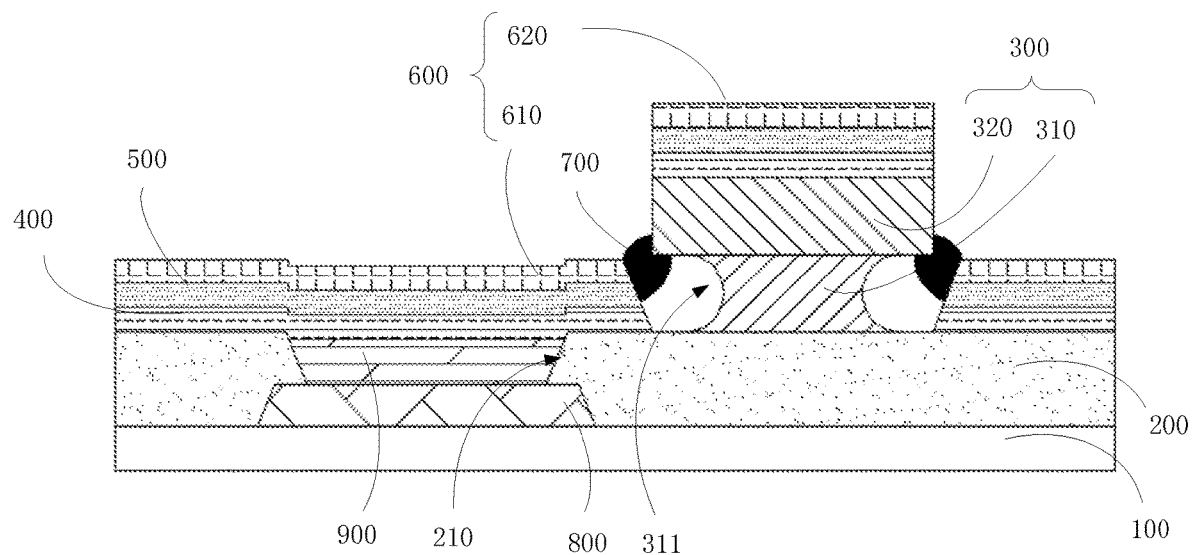

According to the above purpose, the present application further provides a manufacturing method of the display panel, as shown in FIG. 3, including the steps of:

step S10, as shown in FIG. 4, providing a substrate 100 and forming a pixel defining layer 200 with a plurality of pixel openings 210 on the substrate 100;

step S20, as shown in FIGS. 5 and 6, forming an auxiliary electrode layer 300 on the pixel defining layer 200 and adjacent to each of the plurality of pixel openings 210, wherein the auxiliary electrode layer 300 includes a first auxiliary electrode sublayer 310 formed on the pixel defining layer 200 and a second auxiliary electrode sublayer 320 formed on the first auxiliary electrode sublayer 310, and the first auxiliary electrode sublayer 310 is formed with a groove portion 311 near each of the plurality of pixel openings 210;

step S30, as shown in FIG. 7, sequentially forming an electron transport layer 400 and a cathode layer 500 on the pixel defining layer 200 and the auxiliary electrode layer 300; and step S40, as shown in FIG. 8, forming an organic layer 600 on the cathode layer 500 and forming a metal layer 700 corresponding to the groove portion 311 between the second auxiliary electrode sublayer 320 and the cathode layer 500.

In an embodiment, in the step S20, forming the auxiliary electrode layer 300 on the pixel defining layer 200 and adjacent to each of the plurality of pixel openings 210, wherein the auxiliary electrode layer 300 includes the first auxiliary electrode sublayer 310 formed on the pixel defining layer 200 and the second auxiliary electrode sublayer 320 formed on the first auxiliary electrode sublayer 310, and the first auxiliary electrode sublayer 310 is formed with the groove portion 311 near each of the plurality of pixel openings 210 includes the steps of:

step S21, forming the first auxiliary electrode sublayer 310 on the pixel defining layer 200, wherein a thickness of the first auxiliary electrode sublayer 310 is greater than a sum of thicknesses of the electron transport layer 400, the cathode layer 500, and the organic layer 600;

step S22, forming the second auxiliary electrode sublayer 320 on the first auxiliary electrode sublayer 310; and step S23, forming the groove portion 311 on the first auxiliary electrode sublayer 310 near each of the plurality of pixel openings 210.

Material of the first auxiliary electrode sublayer 310 is different from material of the second auxiliary electrode sublayer 320. Specifically, the material of the first auxiliary electrode sublayer 310 includes aluminum or silver, and the material of the second auxiliary electrode sublayer 320 includes transparent oxide.

Because the material of the first auxiliary electrode sublayer 310 is different from the material of the second auxiliary electrode sublayer 320, the groove portion 311 can be formed on the first auxiliary electrode sublayer 310 by etching first auxiliary electrode sublayer 310 without etching the second auxiliary electrode sublayer 320.

In an embodiment, in the step S40, forming an organic layer 600 on the cathode layer 500 and forming a metal layer 700 corresponding to the groove portion 311 between the second auxiliary electrode sublayer 320 and the cathode layer 500 includes the steps of:

step S41, forming the organic layer 600 on the cathode layer 500, wherein material of the organic layer 600 includes a conductive patterning material; and step S42, forming the metal layer 700 corresponding to the groove portion 311 between the second auxiliary electrode sublayer 320 and the cathode layer 500 by using a conductive electrode material mutually exclusive with the conductive patterning material of the organic layer 600.

The material of the organic layer 600 includes the conductive patterning material (CPM), the material of the metal layer 700 includes the conductive electrode material (CEM), and the conductive patterning material and the conductive electrode material are mutually exclusive. Understandably, because the conductive patterning material and the conductive electrode material are mutually exclusive, in an actual production, the organic layer 600 can be deposited first, and then the metal layer 700 can be deposited. Because the two material are mutually exclusive, the metal layer 700 has a self-assembly process, and the metal layer 700 is deposited only in a region not covered by the organic layer 600, which means that the metal layer 700 is patterned in a negative region of the organic layer 600. Specifically, the metal layer 700 is formed in a region not formed with the organic layer 600, on which the opening of the present application is formed. A vapor deposition temperature of the organic layer 600 ranges from 150 to 250° C. A vapor deposition temperature of the metal layer ranges from 500 to 650° C.

In summary, the present application disposes the auxiliary electrode layer 300 on the pixel defining layer 200 and electrically connects the second auxiliary electrode sublayer 320 in the auxiliary electrode layer 300 to the cathode layer 500 by the metal layer 700, thereby reducing the resistance of the cathode layer 500, reducing the power supply voltage drop of the display panel, and ensuring the brightness uniformity of the display panel. In addition, the manufacturing method of the display panel is simple and efficient, which is suitable for mass production.

Understandably, those having ordinary skills of the art may easily contemplate various changes and modifications of the technical solution and technical ideas of the present application and all these changes and modifications are considered within the protection scope of right for the present application.

What is claimed is:

1. A display panel, comprising:
   a substrate;
   a pixel defining layer disposed on the substrate and provided with a plurality of pixel openings;
   an auxiliary electrode layer disposed on the pixel defining layer and adjacent to each of the plurality of pixel openings, wherein the auxiliary electrode layer comprises a first auxiliary electrode sublayer disposed on the pixel defining layer and a second auxiliary electrode sublayer disposed on the first auxiliary electrode sublayer, and the first auxiliary electrode sublayer is provided with a groove portion near each of the plurality of pixel openings;
   an electron transport layer disposed on the pixel defining layer and the auxiliary electrode layer;
   a cathode layer disposed on the electron transport layer;
   an organic layer disposed on the cathode layer; and
   a metal layer disposed between the second auxiliary electrode sublayer and the cathode layer and corresponding to the groove portion;
   wherein a thickness of the first auxiliary electrode sublayer is greater than a sum of thicknesses of the electron transport layer, the cathode layer, and the organic layer.

2. The display panel as claimed in claim 1, wherein an opening is disposed between the second auxiliary electrode sublayer and the organic layer and is in communication with the groove portion, and the metal layer is disposed at the opening and connected to the second auxiliary electrode sublayer and the cathode layer.

3. The display panel as claimed in claim 2, wherein the organic layer comprises a first organic sublayer disposed on the pixel defining layer and a second organic sublayer disposed on the auxiliary electrode layer, the first organic sublayer and the second organic sublayer have same material, and the opening is disposed between the first organic sublayer and the second auxiliary electrode sublayer.

4. The display panel as claimed in claim 1, wherein a material of the first auxiliary electrode sublayer comprises aluminum or silver, and a material of the second auxiliary electrode sublayer comprises transparent oxide.

5. The display panel as claimed in claim 1, wherein a material of the organic layer comprises a conductive patterning material, a material of the metal layer comprises a conductive electrode material, and the conductive patterning material and the conductive electrode material are mutually exclusive.

6. The display panel as claimed in claim 1, further comprising an anode layer disposed on the substrate and corresponding to each of the plurality of pixel openings and an organic light-emitting layer disposed in each of the plurality of pixel openings and disposed on the anode layer, wherein the electron transport layer is disposed on the organic light-emitting layer, the pixel defining layer, and the auxiliary electrode layer.

7. A manufacturing method of a display panel, comprising the steps of:
- providing a substrate and forming a pixel defining layer with a plurality of pixel openings on the substrate;
- forming an auxiliary electrode layer on the pixel defining layer and adjacent to each of the plurality of pixel openings, wherein the auxiliary electrode layer comprises a first auxiliary electrode sublayer formed on the pixel defining layer and a second auxiliary electrode sublayer formed on the first auxiliary electrode sublayer, and the first auxiliary electrode sublayer is formed with a groove portion near each of the plurality of pixel openings;
- sequentially forming an electron transport layer and a cathode layer on the pixel defining layer and the auxiliary electrode layer; and
- forming an organic layer on the cathode layer and forming a metal layer corresponding to the groove portion between the second auxiliary electrode sublayer and the cathode layer;

wherein a thickness of the first auxiliary electrode sublayer is greater than a sum of thicknesses of the electron transport layer, the cathode layer, and the organic layer.

8. The manufacturing method of the display panel as claimed in claim 7, wherein the step of forming the organic layer on the cathode layer and forming the metal layer corresponding to the groove portion between the second auxiliary electrode sublayer and the cathode layer comprises the steps of:
- forming the organic layer on the cathode layer, wherein a material of the organic layer comprises a conductive patterning material; and
- forming the metal layer corresponding to the groove portion between the second auxiliary electrode sublayer and the cathode layer by using a conductive electrode material mutually exclusive with the conductive patterning material of the organic layer.

9. The manufacturing method of the display panel as claimed in claim 8, wherein the organic layer and the metal layer are both made by evaporation.

10. The manufacturing method of the display panel as claimed in claim 9, wherein a vapor deposition temperature of the organic layer ranges from 150 to 250° C.

11. The manufacturing method of the display panel as claimed in claim 9, wherein a vapor deposition temperature of the metal layer ranges from 500 to 650° C.

* * * * *